(12) United States Patent
Skrovan

(10) Patent No.: US 6,391,779 B1
(45) Date of Patent: *May 21, 2002

(54) PLANARIZATION PROCESS

(75) Inventor: John Skrovan, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,635

(22) Filed: Aug. 11, 1998

(51) Int. Cl.[7] ............................................. H01L 21/302
(52) U.S. Cl. ..................... 438/691; 438/692; 451/285
(58) Field of Search ................................ 438/691, 692, 438/694, 699; 216/38, 88; 451/41, 285, 287

(56) References Cited

U.S. PATENT DOCUMENTS

| | | | |
|---|---|---|---|
| 4,680,893 A | | 7/1987 | Chronkhite et al. .......... 51/5 R |
| 5,142,828 A | | 9/1992 | Curry, II ................... 51/281 R |
| 5,216,843 A | | 6/1993 | Breivogel et al. .......... 51/131.1 |
| 5,514,245 A | | 5/1996 | Doan et al. .............. 156/636.1 |
| 5,558,563 A | * | 9/1996 | Cote et al. ..................... 451/41 |
| 5,665,199 A | | 9/1997 | Sahota et al. ................. 438/14 |
| 5,665,202 A | * | 9/1997 | Subramanian et al. ...... 438/692 |
| 5,720,845 A | | 2/1998 | Liu ............................. 156/345 |
| 5,786,275 A | * | 7/1998 | Kubo ......................... 438/692 |
| 5,913,712 A | * | 6/1999 | Molinar ........................ 451/41 |
| 5,957,764 A | | 9/1999 | Anderson et al. ........... 451/285 |
| 6,139,400 A | * | 10/2000 | Sato et al. ..................... 451/10 |

OTHER PUBLICATIONS

Gurtej s. Sandhu, Sujit Sharan, "Low Scratch Density Chemical Mechanical Planarization Process", 1997, pp. 1–14 Application No. 08/874,779, Filing Date Jun. 13, 1997.

* cited by examiner

Primary Examiner—Felisa Hiteshew
Assistant Examiner—Kin-Chan Chen
(74) Attorney, Agent, or Firm—Workman, Nydegger & Seeley

(57) ABSTRACT

A series of process steps is described for the planarization of a semiconductor substrate, such as a semiconductor wafer, using a linear track polisher, a rotational polisher, or the combination of both. The process steps include a first processing step at a first polishing pressure and a first continuous polishing surface speed which enables a relatively high rate of material removal from the surface of the semiconductor substrate, and a second processing step at a second polishing pressure and a second continuous polishing surface speed which removes any surface scratches, abrasions, or other defects which may have been induced during the first processing step. The same continuous polishing surface can be used in both the first and second processing steps. An alternative third processing step is described wherein an abrasive chemical slurry, used in the first and second processing steps to facilitate material removal, is converted to a non-abrasive, pH controlled cleaning solution to facilitate substrate pre-cleaning and to prevent build-up of particles on a polishing surface of the linear track or rotational polisher.

36 Claims, 2 Drawing Sheets

PLANARIZATION PROCESS

BACKGROUND OF THE INVENTION

1. The Field of the Invention

The present invention relates to the processing of semiconductor substrates, such as silicon wafers, which are used in the manufacture of semiconductor devices. The present invention more specifically relates to the polishing or planarizing of the surfaces of semiconductor substrates using a process known as chemical mechanical planarization (CMP). Methods disclosed herein improve the result of CMP processes when performed on an apparatus known as a linear track polisher, or on an apparatus known as a rotational polisher.

2. The Relevant Technology

In the fabrication of integrated circuits, numerous integrated circuits are typically constructed simultaneously on a single semiconductor substrate. To reduce the cost of producing individual semiconductor devices, it has long been an objective of semiconductor manufacturers to increase the number of devices on a single substrate. For a period of time this was accomplished primarily by a continual scaling down of the geometries of individual active devices within the integrated circuits.

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon which is typically single crystalline.

The scaling of active devices eventually became less profitable as the limitations of the circuit speed and maximum functional density came to depend more on the characteristics of the electrical interconnects of the devices than on the scale of the devices themselves. In addition, the aspects of silicon utilization, chip costs, and ease of flexibility of integrated circuit design were also adversely affected by electrical interconnect technology restrictions. The approaches to lifting these limitations have involved the implementation of vertical stacking or integration of devices and their associated electrical interconnections, commonly referred to as multilevel interconnect (MLI) schemes. In MLI schemes, individual conductor layers are separated by dielectric layers which are sandwiched between the conductor layers. These dielectric layers are typically oxide or nitride layers which are grown or deposited on the substrate and are known as interlevel dielectrics (ILD).

One drawback of multilevel interconnection is a loss of topological planarity. Loss of planarity results in associated problems in photolithography and etch, as well as other problems. To alleviate these problems, the substrate is planarized at various points in the process to minimize non-planar topography and its adverse effects. As additional levels are added to multilevel interconnection schemes and circuit features are scaled to sub-micron dimensions, the required degree of planarization increases. Such planarization can be performed on either the conductor or the inter-level dielectric layers to remove high topography or to remove embedded particles.

The polishing process may also involve the introduction of a chemical slurry to facilitate higher removal rates and selectivity between films of the semiconductor surface. This polishing process is often referred to as chemical mechanical planarization (CMP). The chemical slurry used in CMP contains abrasives therein to assist in the mechanical removal of the layer. When fixed abrasives are incorporated into a polishing pad in a CMP process, abrasives are not needed in the chemical slurry, and a liquid ammonium solution can be used in lieu of a slurry while dripped onto the polish pad during the polishing process.

CMP is implemented in dielectric layer planarization by growing or depositing a layer, such as oxide or nitride, on the semiconductor substrate, typically to fill in contact regions or trenches between metallization lines, and then removing the excess dielectric material using the CMP process, until a flat, smooth surface is achieved.

CMP processes have been used in the semiconductor industry for many years. A primary application of CMP processing has been the polishing of silicon substrates, such as silicon wafers, before active device fabrication. Only in recent years has the CMP process been applied to planarizing metallization layers and their inter-dielectric layers, and these new applications are the result of integrated circuit device fabrication processing scaling down to deep submicron geometries. A major hurdle to overcome in adapting CMP processes to the planarization of metallization and dielectric layers is that the typical thicknesses of the layers being planarized, and the variations in final thicknesses allowed over the entire surface area of the layers, are smaller than the critical dimensions associated with earlier semiconductor applications.

In addition to the need for tight tolerances in the planarizing of semiconductor metal and dielectric layers, there is a continuing need to reduce the amount of process time associated with the CMP material removal steps.

A type of apparatus known as a rotational polisher has been used widely in the practice of chemical mechanical planarization. The rotational polishing process involves under controlled pressure and temperature. An example of such an apparatus is the Model 372 Polisher manufactured and distributed by IPEC Westech Systems, of San Jose, Calif.

FIG. 1 shows a rotational polisher 11 having a rotatable polishing platen 12, a substrate polishing head assembly 14 and a chemical supply system 18. Platen 12 is typically covered with a replaceable, relatively soft material 16 such as polyurethane.

Substrate polishing head assembly 14 holds semiconductor substrate 10 adjacent to platen 12. Substrate polishing head assembly 14 includes a motor (not shown) for rotating the polishing head and semiconductor substrate 10. Substrate polishing head assembly 14 further includes a polishing head displacement mechanism (not shown) which moves the substrate 10 back and forth across the platen 12 as it is rotating. Substrate polishing head assembly 14 applies a controlled downward pressure to semiconductor substrate 10 to hold semiconductor substrate 10 against rotating platen 12 so that a continuous polishing surface 34 on rotating 12 platen polishes semiconductor substrate 10. Chemical supply system 18 introduces a polishing slurry (not shown) to be used as an abrasive medium between platen 12 and semiconductor substrate 10.

Chemical mechanical planarization (CMP) using a rotational polishing system is a conventional polishing process. Examples of CMP are seen in U.S. Pat. No. 4,680,893 issued on Jul. 21, 1987 to Cronkhite et al., U.S. Pat. No. 5,142,828 issued on Sep. 1, 1992 to Curry, II, and U.S. Pat. No. 5,514,245 issued on May 7, 1996 to Doan et al. The Cronkhite et al. reference teaches polishing bare silicon wafers after they have been cut from a silicon ingot. The polishing requires two similar polishing steps using two dissimilar pads and two dissimilar polishing pressures. The Curry, II reference teaches removal of a defective metallization layer by a single CMP process, followed by formation of a replacement defect-free metallization layer. The single CMP process of Curry, II uses a single polishing pad at a single pressure on the defective metallization layer to remove the same. The Doan et al. reference teaches two CMP steps for planarizing a dielectric layer on a wafer. Like the Cronkhite et al. reference, the Doan et al. reference requires two dissimilar polishing pads in two respective CMP steps. The first CMP step creates defects in the polished surface and uses a hard and low compressibility polishing pad. The defects in the polished surface are removed by a second CMP step that uses a high compressibility and low hardness polishing pad. The pressure is recommended to be the same in the two CMP steps.

Limitations of conventional rotational CMP polishing apparatus and processes are known to exist. While it is preferable to have a constant material removal rate across the entire surface of the substrate, the removal rate is inherently related to the radial position of the substrate on the platen. The removal rate is increased as the semiconductor substrate is moved radially outward relative to the polishing platen due to higher platen rotational velocity. Additionally, removal rates tend to be higher at the edge of the substrate than at the center of the substrate because the edge of the substrate is rotating at a higher speed than the center of the substrate. FIG. 2 illustrates a perspective view, not to scale, of a topology having a typical thickness profile on a semiconductor substrate 10 which is an example of that which may be realized when planarizing a semiconductor substrate using rotational polisher 11 as described above.

It is known in the art that the material removal rate realized during a CMP process can be increased by adjustments such as increasing the downward pressure of substrate polishing head assembly 14 or by increasing the rotational speeds of either substrate polishing head assembly 14 or platen 12. The adjustments, however, only accentuate the unacceptable variations in semiconductor substrate thickness described above. Furthermore, the trend towards increasing the overall size of semiconductor substrates makes it increasingly difficult to hold the necessary tolerances across the entire substrate.

Doped silicon dioxide layer materials known as phosphosilicate glass (PSG) and borophosphosilicate glass (BPSG) are used widely in the fabrication of semiconductor devices, and have been further used to provide a measure of surface planarity. Phosphorus-doped oxides are known to have numerous properties which are beneficial to the long term reliability of semiconductor devices, such as providing an improved barrier to moisture penetration, and acting as an effective trap for mobile ionic contaminants. In addition, PSG and BPSG materials have been used to achieve a measure of substrate surface planarity by depositing a PSG or BPSG layer on a substrate surface, then heating the substrate to flow the glass and planarize the layer. Such a technique is commonly referred to as reflow and has proven useful in the fabrication of semiconductor devices with relatively large geometries. BPSG films reduce reflow temperatures in such processes because boron plays a principal role in the lowering of glass viscosity.

Limitations to the use of PSG and BPSG reflow are known to exist, particularly when fabricating semiconductors which have relatively small device geometries or which have three or more dielectric/metal layers. The total thermal budget available to the reflow processes for such devices has to be minimized. Consequently, in order to produce the same degree of planarization obtained in higher temperature processes, the dopant concentration in the BPSG film must be further increased. When working with dimensions below 0.35 microns, however, higher doping levels of boron and phosphorus in the doped film fail to achieve the desired results, and CMP processes must be used on these layers in addition to reflow to fully planarize the substrate surface.

Planarization methods have been developed using a linear track polisher. An example of a linear track polisher is that which is manufactured by OnTrak Systems, Incorporated, of Milpitas, Calif. FIG. 3 shows an example of such an apparatus. Linear track polisher 30 includes a substrate polishing head assembly 32, a continuous belt having a continuous polishing surface 34 thereon, and a chemical mixture feed assembly 36. Continuous polishing surface 34 is typically composed of a soft material such as polyurethane, similar to a typical polishing pad on a rotational polisher. The continuous belt of a linear track polisher may be less rigid than a typical polishing pad on a rotational polisher, such as rotational polisher 11 in FIG. 1. The speeds of the continuous belt which linear track polishers are capable of achieving, however, tend to compensate for the lack of rigidity of the continuous belt.

A constant downward pressure is applied to the substrate polishing head assembly 32, holding a semiconductor substrate 10 against continuous polishing surface 34. Belt drive motors drive two belt drums 38 which cause continuous polishing surface 34 to move in the direction as indicated by arrows seen in FIG. 3. Continuous polishing surface 34 may consist of a polyurethane type material. The chemical mixture feed assembly 36 delivers a liquid or aqueous mixture to the region where semiconductor substrate 10 makes contact with continuous polishing surface 34. The liquid or aqueous mixture is typically a colloidal slurry with abrasive characteristics suitable for the specific type of material being removed. In another embodiment, continuous polishing surface 34 may also contain fixed abrasives incorporated into a resin material. In the case of this other embodiment of continuous polishing surface 34, the liquid or aqueous mixture need not have abrasive characteristics.

While the linear track polisher has shown potential for improving the rate of material removal during a CMP operation on a semiconductor substrate, thereby improving the rate at which semiconductor substrate can be processed, advancements are needed to simplify the processing and improve the results obtained. In the case of both rotational polishers and linear track polishers, advancements are needed to reduce unacceptable variations in semiconductor substrate thickness in order to accommodate the trend towards increasing the overall size of semiconductor substrates by holding to necessary tolerances across the entire semiconductor substrate.

SUMMARY OF THE INVENTION

A novel method for the planarization of a semiconductor substrate is disclosed herein. The novel method can be performed on different polishing apparatus in which a continuous polishing surface polishes a front planar surface of a semiconductor substrate. The polishing apparatus can be either a rotational polisher or a linear track polisher. In a rotational polisher, the continuous polishing surface is situated on a polishing pad that rotates relative to the front planar surface of the semiconductor substrate. In a linear track polisher, there is a substrate polishing head assembly in which the semiconductor substrate is affixed so that the planar surface of the semiconductor substrate forms a polishing interface with a continuous polishing surface situated upon a continuous or endless belt.

In summary, the novel method includes the steps of applying a first polishing pressure to the substrate polishing head assembly against the continuous polishing surface, the continuous polishing surface moving at a first polishing speed for a first selected time, with a first liquid or aqueous mixture applied to a region between the substrate polishing head assembly and the continuous polishing surface on the front planar surface of the semiconductor substrate. Next, a second polishing pressure is applied to the substrate polishing head assembly against the same continuous polishing surface, the continuous polishing surface moving at a second polishing speed for a second selected time, with a second liquid or aqueous mixture applied to region between the substrate polishing head assembly and the continuous polishing surface on the front planar surface of the semiconductor substrate, wherein the second polishing pressure is less than the first polishing pressure and the second polishing speed is less than the first polishing speed.

As a further aspect to the novel method disclosed herein a third polishing pressure at a third polishing speed for a third selected time can be effected, wherein a third liquid or aqueous mixture is applied to a region between the substrate polishing head assembly and the continuous polishing surface on the front planar surface of the semiconductor substrate, wherein the third liquid or aqueous mixture contains no abrasive or colloidal elements. In this step, the third pressure and speed are less than, respectively, the first and second pressures and speeds.

BRIEF DESCRIPTION OF THE DRAWINGS

A more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE
PREFERRED EMBODIMENTS

Advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
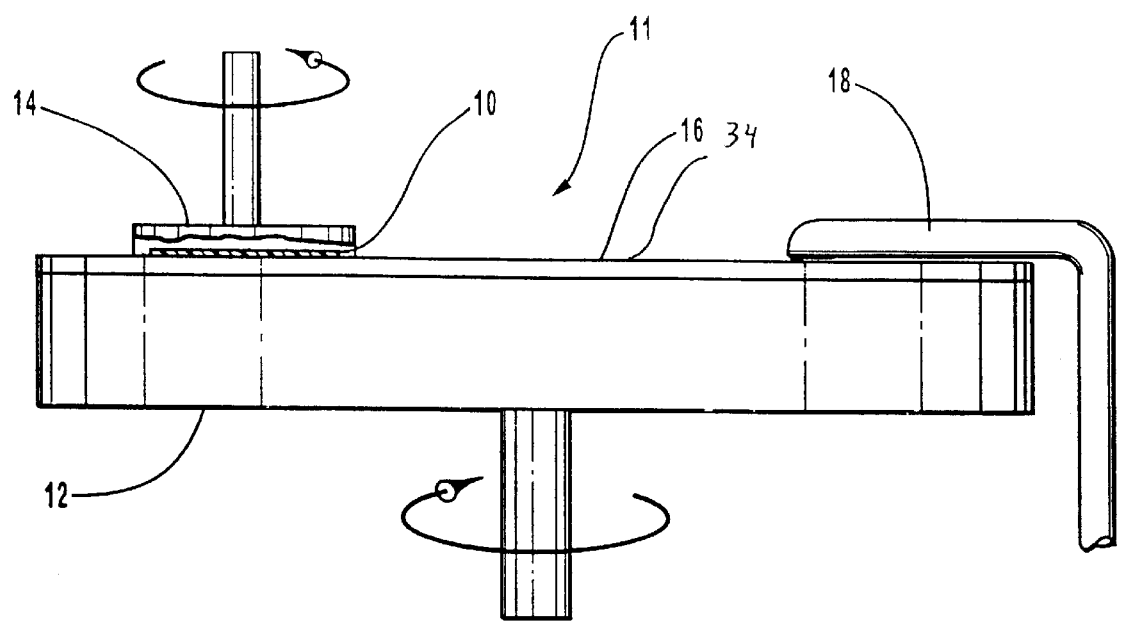
FIG. 1 is a simplified schematic of a rotational polishing apparatus for performing a planarizing operation on a semiconductor substrate.
Figure 2:
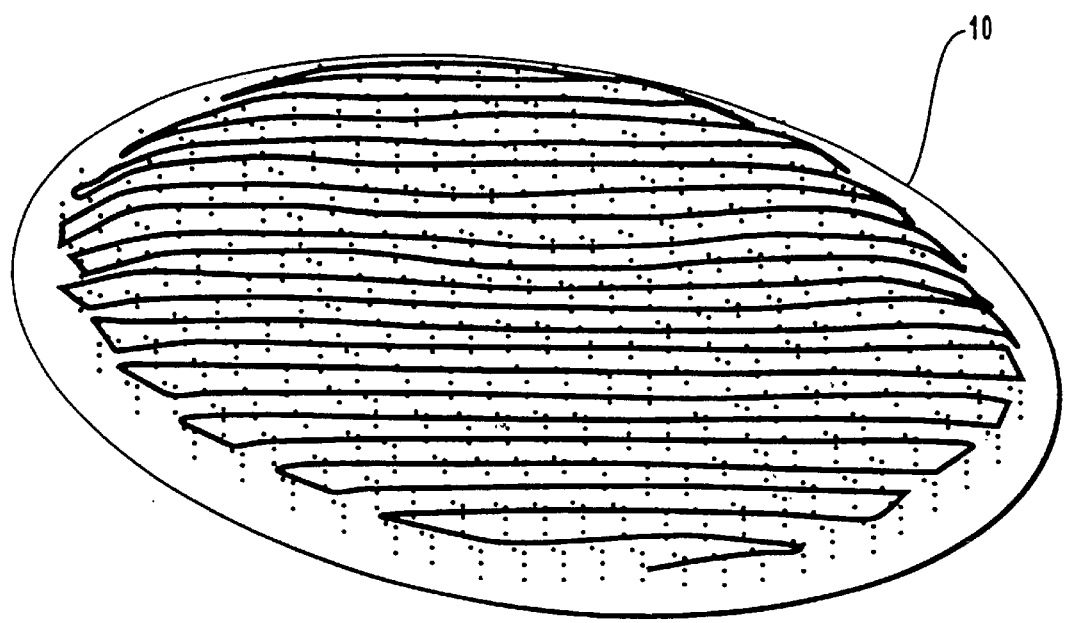
FIG. 2 is an illustration of a semiconductor substrate after planarization.
Figure 3:
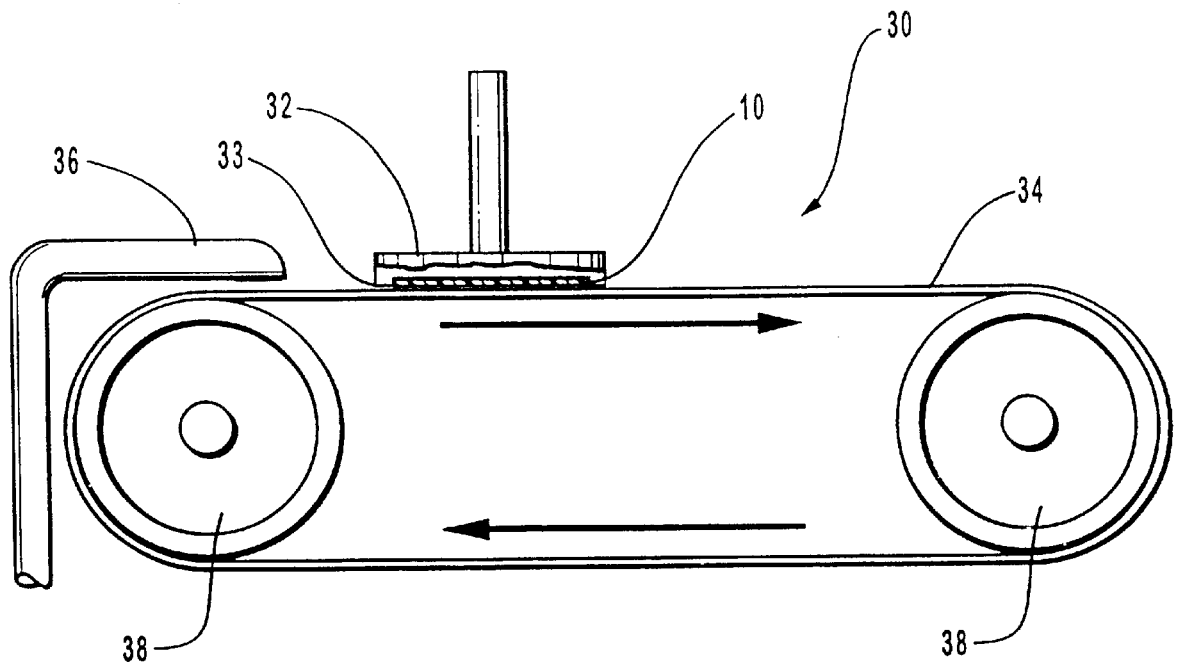
FIG. 3 is a simplified schematic of a linear track polishing apparatus.
Figure 4:
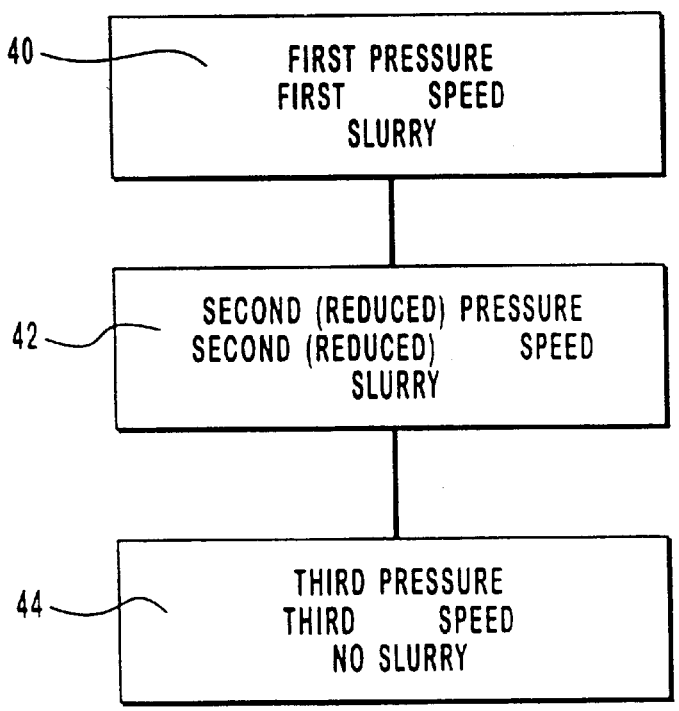
FIG. 4 is a block diagram of processing steps used in chemical mechanical planarization (CMP) of a semiconductor substrate.

FIG. 4 depicts a planarization process flow that can be performed on either a rotational polisher, such as is seen in FIG. 1, or on a linear track polisher, such as is seen in FIG. 3. The example given below, which is also applicable to rotational polishers, is given with reference to linear track polisher 30 seen in FIG. 3. In a rotational polisher, the continuous polishing surface is situated on a polishing pad. The nature of polishing in a rotational polisher is that the relative speed constantly changes between the polishing pad and any point on the front planar surface of the semiconductor substrate. The reason for the constantly changing relative speed is that the polishing pad and points on the front planar surface of the semiconductor substrate are rotating with respect to each other. The nature of polishing with a linear track polisher, however, is different than that of rotational polishers. In a linear track polishing apparatus, the continuous polishing surface is situated on a continuous or endless belt where the relative speed is constant between any point on the front planar surface of the semiconductor substrate and the endless belt.

First processing step 40 in FIG. 4 includes applying a first polishing pressure to substrate polishing head assembly 32 in which semiconductor substrate 10 is affixed so that a front planar surface (not shown) of semiconductor substrate 10 forms a polishing interface 33 with a continuous polishing surface 34 situated on a continuous belt at the first polishing pressure, while continuous polishing surface 34 moves at a first polishing speed, with a first liquid or aqueous mixture applied to a region including the polishing interface 33.

When it is desired to polish an oxide of silicon, a preferred setting for the first polishing pressure is in a range of about 15 KPa to about 40 KPa, and a more preferred range is about 20 KPa to about 28 KPa. When a linear track polisher is used for polishing oxides of silicon, a preferred setting for the first polishing speed is about 300 feet/minute, although speeds in a range of about 100 feet/minute to about 500 feet/minute could be used. The first liquid or aqueous mixture is a colloidal slurry such as is used in a conventional rotational chemical mechanical planarizing apparatus and is well known to those skilled in the art.

A second processing step 42 includes applying a second polishing pressure, lower than the first polishing pressure, to the substrate polishing head assembly 32 which is transmitted to polishing interface 33, while continuous polishing surface 34 moves at a second polishing speed, with a second liquid or aqueous mixture applied to a region including polishing interface 33. The first and second pressures are preferably selected prior to the polishing process. The applied polishing pressure can be decreased either immediately or progressively from the first polishing pressure to the second polishing pressure. It is not necessary to change continuous polishing surface 34 between first and second processing steps 40, 42. Rather, the same continuous polishing surface 34 can also be used in second processing step 42 as was used in first processing step 40. Use of the same continuous polishing surface 34 in both first processing step 40 and second processing step 42 will not detract from the intended result.

In order to determine when to initiate second processing step 42, it is preferable to know the material removal rate of first processing step 40, the desired final thickness of the material being polished, and the maximum depth of the scratches being created in the material by first processing step 40. It is preferable that second processing step 42 be initiated, given the material removal rate of first processing step 40, before the thickness of the material being polished in first processing step 40 is less than or equal to the sum of the maximum depth of the scratches being created in the material by first processing step 40 and the desired final thickness of the material. When so initiated, second processing step 42 will preferably remove the scratches being created in the material by first processing step 40 and will continue removing the material being polished until the desired final thickness of the material is achieved.

A preferred setting for the polishing second pressure in a rotational polisher, when polishing oxides of silicon, is in a range of about 9.0 to about 15 KPa although pressures in a range of about 3.5 to about 21 KPa could be used. Where a linear track polisher is used for polishing oxides of silicon, a preferred setting for the second polishing speed is about 100 feet/minute, although speeds in a range of about 50 feet/minute to about 300 feet/minute could also be used.

In the preferred embodiment the second liquid or aqueous mixture is identical to the colloidal slurry used in the first liquid or aqueous mixture. It is preferable that the second polishing pressure and the second polishing speed are both lower in magnitude than the respective first polishing pressure and first polishing speed. As an alternative, a continuous polishing surface can have fixed abrasives incorporated therein and polishing can be performed upon a surface of a semiconductor substrate without an abrasives-containing colloidal slurry. In this case, a liquid solution, such as ammonia for polishing oxides of silicon, can be dripped upon the surface during polishing. In this alternative embodiment, the continuous polishing surface can be situated on a polishing pad of a rotational polisher or on a continuous or endless belt of a linear track polisher.

First processing step 40 removes more material from the front planar surface of the semiconductor substrate than does second processing step 42. In this manner, the planarization process can be optimized such that a large percentage of the desired material removal occurs in the first processing step 40, at a higher removal rate, so as to decrease the total processing time required for the CMP. The lower values of the second polishing pressure and second polishing speed are chosen so as to minimize the number and size of scratches and other surface defects induced in the front planar surface of the semiconductor substrate. It is a benefit conferred by second processing step 42 that scratches and other surface defects, which may be induced at the higher removal rates of first processing step 40, are removed during second processing step 42, provided that such scratches and other surface defects are not deeper than the material thickness removed during second processing step 42.

Referring to the above description of the forgoing embodiment, it will be clear to those skilled in the art that, depending upon the particular type of continuous polishing surface being used, the settings for the first and second polishing pressures need to be varied to obtain optimum material removal rates for the various types of material for which planarization is desired. For linear track polishers, it has been observed in the planarization of $SiO_2$ layers grown or deposited on semiconductor substrates using a slurry having a composition of ammonia or KOH with a base pH in a range from about 8 to about 12 and preferably about 11, that material removal rates are achieved in a range from about 3000 Å/minute to about 5000 Å/minute for first processing step 40 and about 1000 Å/minute for second processing step 42. By way of example, a suitable slurry is Rodel ILD 1300 manufactured by Rodel Co. located in Newark, Del. The first and second selected times will be selected based upon the actual material removal rates achieved in practice together with the desired amount of material to be removed from the front planar surface of the semiconductor substrate during planarization.

While the present invention may be practiced using only first processing step 40 and second processing step 42, another preferred embodiment of the invention is the inclusion of a third processing step 44 which will now be described. Third processing step 44 includes applying a third polishing pressure to the substrate polishing head assembly 32 which is transmitted to polishing interface 33, while continuous polishing surface 34 moves at a third polishing speed, with a third liquid or aqueous mixture applied to a region including polishing interface 33. The preferred setting for the third polishing pressure in a rotational polisher, when polishing oxides silicon, is in a range of about 9.0 to about 15 KPa, although a pressure which is less than the second polishing pressure and greater than about 3.5 KPa could be used. When a linear track polisher is used in the polishing oxides of silicon, the preferred setting for the third polishing speed is 100 feet/minute, although a speed which is less than the second polishing speed and greater than 50 feet/minute could be used. The preferred formulation of the third liquid or aqueous mixture is de-ionized water with a solution added thereto, such as trimethylammonium hydroxide (TMAH), wherein a preferred formulation has a pH of about 10 for an oxide layer planarization and a pH in a range of about 2 to about 4 for a metal layer planarization. Alternately, pure de-ionized water could be used for the third aqueous mixture.

A purpose of third processing step 44 is to pre-clean the semiconductor substrate before it is transferred from the polishing apparatus to a cleaning station for a more thorough cleaning. Another purpose of third processing step 44 is the removal of particles which may accumulate on the polishing surface or the polishing interface between the polishing surface and the semiconductor substrate during first and second processing steps 40, 42 and which in turn may reduce the material removal rates achieved by the polishing apparatus. Third processing step 44 removes particles, such as colloidal silica or alumina particles, which are a part of the first and second liquid or aqueous mixtures and which create the abrasive action needed to induce planarization. During third processing step 44, abrasive agents are removed, material removal from the front planarized surface of the semiconductor substrate stops, and particulate matter inherent to first and second processing steps 40, 42 are carried away by the third liquid or aqueous mixture. Controlling the pH as described herein causes the material particles to electrostatically repel each other and not agglomerate into larger particles, thereby making it easier for them to be carried away in solution and also decreasing the probability of particle-induced scratches on the front planarized surface of the semiconductor substrate. Processing times for third processing step 44 vary with the desired degree of pre-cleaning.

By performing third processing step 44, the semiconductor substrate is delivered to the cleaning station in a cleaner condition, thereby increasing the likelihood that all particles will be removed during a subsequent thorough cleaning. Additionally, third processing step 44 enables the continuous polishing surface to be used for an increased number of substrates before it must be taken out of service for cleaning or reconditioning.

The inventive method can be performed upon either a rotational polisher, such as is seen in FIG. 1, or upon a linear track polisher, such as is seen in FIG. 3. Alternatively, both a rotational polisher and a linear track polisher can be used.

The present invention may also be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A polisher-independent planarization method for a planar top surface on a material to form a planarized material of final thickness $T_F$ from an original material of initial thickness $T_0$, the material to be planarized having a plurality of recesses through said planar top surface to be removed by planarization, the method comprising:

applying across the planar top surface a first polishing pressure against a continuous polishing surface to:
maintain the planarity of the top surface; and
decrease the thickness of the material to a thickness $T_1$, wherein $T_F<T_1<T_0$, said applying a first polishing pressure causes the formation of scratches on the top surface of said material of thickness $T_1$, and the decrease of the thickness of the material to a thickness $T_1$ consists of material removal from the planar top surface in a first amount of removed material;

applying across the planar top surface a second polishing pressure against said continuous polishing surface, the second polishing pressure being less than the first polishing pressure, to:
maintain the planarity of the top surface; and
remove the plurality of recesses;
such that the applying of the second polishing pressure is initiated before the scratches caused on the surface of said material of thickness $T_1$ penetrate into the material of final thickness $T_F$, and the plurality of recesses removal consists of material removal from the planar top surface in a second amount of removed material, wherein said first amount of removed material is greater than said second amount of removed material.

2. The method as defined in claim 1, further comprising, prior to applying said first polishing pressure, applying an initial polishing pressure to the material to form:
the planar top surface of the material; and
the plurality of recesses each extending from the planar top surface into the material by not more than a depth $T_0-T_F$.

3. The method as defined in claim 2, wherein the initial polishing pressure is greater than the first polishing pressure.

4. The method as defined in claim 1, wherein the first and second polishing pressures are each applied using a polishing machine selected from the group consisting of a rotational polisher and a linear track polisher.

5. The method as defined in claim 1, wherein:
the first polishing pressure is applied by a rotational polisher; and
the second polishing pressure is applied using a linear track polisher.

6. The method as defined in claim 1, wherein:
the first and second polishing pressures are applied to the top surface of the material by a planar polishing surface;
while the first and second polishing pressures are applied to the top surface of the material the planar polishing surface moves relative to the top surface of the material, respectively, at a first speed and at a second speed; and
the first speed is greater than the second speed.

7. The method as defined in claim 6, wherein a fluid is applied between the top surface of the material and the planar polishing surface while applying:
the first polishing pressure across the top surface of the material; and
the second polishing pressure across the top surface of the material.

8. The method as defined in claim 1, further comprising applying across the planar top surface of the material a third polishing pressure against a continuous polishing surface, less than the second polishing pressure, to maintain the planarity of the top surface of the material and during which the planar polishing surface moves relative to the top surface of the material at a third speed less than the second speed.

9. The method as defined in claim 8, wherein a fluid is applied between the top surface of the material and the planar polishing surface while applying said third polishing pressure across the top surface of the material, said third fluid containing no abrasive or colloidal elements.

10. The method as defined in claim 1, wherein the second polishing pressure is in a range of from about 50 percent to about 100 percent of the first polishing pressure.

11. The method as defined in claim 1, wherein the second polishing pressure is in a range from about 32 percent to about 75 percent of the first polishing pressure.

12. The method as defined in claim 1, wherein:
a fluid is applied between the top surface of the material and the planar polishing surface while applying said first polishing pressure across the top surface of the material;
the planar polishing surface comprises fixed abrasives; and
the fluid is free of abrasives.

13. The method as defined in claim 1, wherein the material is selected from the group consisting of doped silicon dioxide, refractory metals, refractory metal silicides, copper, and aluminum.

14. The method as defined in claim 1, wherein:
the first polishing pressure is in a range of about 15 KPa to about 40 KPa;
the second polishing pressure is in a range of about 3.5 KPa to about 21 KPa.

15. The method as defined in claim 1, wherein the planar polishing surface is a polishing pad that is used to apply both of the first and second polishing pressures.

16. The method as defined in claim 1, wherein applying across the planar top surface of the material said second polishing pressure, less than the first polishing pressure, further comprises progressively decreasing the pressure applied to the top surface of the material from the first polishing pressure until the pressure applied is equal to the second polishing pressure.

17. The method as defined in claim 1, wherein applying across the planar top surface of the material said second polishing pressure, less than the first polishing pressure, further comprises immediately decreasing the pressure applied to the top surface of the material from the first polishing pressure until the pressure applied is equal to the second polishing pressure.

18. A polisher-independent planarization method to remove recesses initially present in a material and to obtain a material of a desired final thickness $T_F$, comprising:

applying an initial polishing pressure to the material to form a planar top surface on the material; and
  to reduce the initial thickness of the material to a thickness $T_1$, such that $T_1>T_F$, wherein said applying an initial polishing pressure causes the formation of scratches on the top surface of said material of thickness $T_1$, and the reduction of the initial thickness of the material to a thickness $T_1$ consists of material removal from the planar top surface in a first amount of removed material;

applying across the planar top surface of the material a first polishing pressure against a continuous polishing surface, less than the initial polishing pressure, to:
  maintain the planarity of the top surface of the material; and
  reduce the thickness $T_1$ to a thickness $T_2>T_F$; and applying across the planar top surface of the material a second polishing pressure against said continuous polishing surface, less than the first polishing pressure, and before the scratches caused on the surface of said material of thickness $T_1$ penetrate into the material of final thickness $T_F$, to:
  maintain the planarity of the top surface of the material;
  remove the plurality of recesses; and
  reduce the thickness $T_2$ to the final thickness $T_F$,
  wherein the plurality of recesses removal consists of material removal from the planar top surface in a second amount of removed material, wherein said first amount of removed material is greater than said second amount of removed material.

19. The method as defined in claim 18, wherein the first and second polishing pressures are each applied using a polishing machine selected from the group consisting of a rotational polisher and a linear track polisher.

20. The method as defined in claim 18, wherein:
the first polishing pressure is applied by a rotational polisher; and
the second polishing pressure is applied using a linear track polisher.

21. The method as defined in claim 18, wherein:
the first and second polishing pressures are applied to the top surface of the material by a planar polishing surface;
while the first and second polishing pressures are applied to the top surface of the material the planar polishing surface moves relative to the top surface of the material, respectively, at a first speed and at a second speed; and
the first speed is greater than the second speed.

22. The method as defined in claim 21, wherein the planar polishing surface is a polishing pad that is used to apply both of the first and second polishing pressures.

23. The method as defined in claim 21, wherein a fluid is applied at an interface between the top surface of the material and the planar polishing surface while applying:
the first polishing pressure across the top surface of the material; and
the second polishing pressure across the top surface of the material.

24. The method as defined in claim 23, wherein the planar polishing surface comprises fixed abrasives and the fluid contains no abrasive elements.

25. The method as defined in claim 18, wherein the material is selected from the group consisting of an electric insulator and an electric conductor.

26. The method as defined in claim 18, wherein applying across the planar top surface of the material said second polishing pressure, less than the first polishing pressure, further comprises progressively decreasing the pressure applied to the top surface of the material from the first polishing pressure until the pressure applied is equal to the second polishing pressure.

27. The method as defined in claim 18, wherein applying across the planar top surface of the material said second polishing pressure, less than the first polishing pressure, further comprises immediately decreasing the pressure applied to the top surface of the material from the first polishing pressure until the pressure applied is equal to the second polishing pressure.

28. A polisher independent planarization method to obtain a material of final thickness $T_F$, comprising:

applying an initial polishing pressure to a material to form:
  a planar top surface;
  a plurality of scratches; and
  to reduce the initial thickness of the material to a thickness $T_1$, such that $T_1>T_F$, wherein the initial thickness reduction consists of material removal from the planar top surface in a first amount of removed material;

applying across the planar top surface of the material both a fluid and a first polishing pressure against a continuous polishing surface, less than the initial polishing pressure, using a planar polishing surface at a first polishing speed to:
  maintain the planarity of the top surface of the material; and
  reduce the thickness $T_1$ to a thickness $T_2>T_F$;

applying across the planar top surface of the material both a fluid and a second polishing pressure against said continuous polishing surface, less than, but not less than about 50 percent of, the first polishing pressure, using said planar polishing surface at a second polishing speed that is less than said first polishing speed, to:
  maintain the planarity of the top surface of the material;
  remove the plurality of scratches; and
  reduce the thickness $T_2$ to a thickness that is greater than or equal to $T_F$; wherein said applying said second polishing pressure is initiated before the scratches on the surface of said material of thickness $T_1$ penetrate into the material of final thickness $T_F$, and the reduction of the thickness $T_1$ to the thickness $T_2$ consists of material removal from the planar top surface in a second amount of removed material, wherein said first amount of removed material is greater than said second amount of removed material, and applying across the planar top surface of the material both a fluid and a third polishing pressure against a continuous polishing surface, less than the second polishing pressure, using said planar polishing surface at a third polishing speed that is less than said second polishing speed to maintain the planarity of the top surface of the material, and such that the thickness of the material is finally $T_F$.

29. The method as defined in claim 28, wherein the initial polishing pressure, and the first and second polishing pressures are each applied using a polishing machine selected from the group consisting of a rotational polisher and a linear track polisher.

30. The method as defined in claim 28, wherein:
the first polishing pressure is applied by a rotational polisher; and
the second polishing pressure is applied using a linear track polisher.

31. The method as defined in claim 28, wherein said of said initial polishing pressure, said first polishing pressure, and said second polishing pressure is applied in a chemical mechanical planarization process using a rotational polisher.

32. The method as defined in claim 28, wherein said initial polishing pressure, said first polishing pressure, and said second polishing pressure are applied using a linear track polisher.

33. The method as defined in claim 28, wherein:
the planar polishing surface comprises fixed abrasives; and
each said fluid is free of abrasives.

34. The method as defined in claim 28, wherein the material is selected from the group consisting of doped silicon dioxide, refractory metals, refractory metal silicides, copper, and aluminum.

35. The method as defined in claim 28, wherein applying across the planar top surface of the material said second polishing pressure further comprises progressively decreasing the pressure applied to the top surface of the material from the first polishing pressure until the pressure applied is equal to the second polishing pressure.

36. The method as defined in claim 28, wherein applying across the planar top surface of the material said second polishing pressure further comprises immediately decreasing the pressure applied to the top surface of the material from the first polishing pressure until the pressure applied is equal to the second polishing pressure.

\* \* \* \* \*

UNITED STATES PATENT AND TRADEMARK OFFICE
CERTIFICATE OF CORRECTION

PATENT NO. : 6,391,779 B1
DATED : May 21, 2002
INVENTOR(S) : John Skrovan

It is certified that error appears in the above-identified patent and that said Letters Patent is hereby corrected as shown below:

Title page,
Item [56], OTHER PUBLICATIONS, after "Gurtej" change "s." to -- S. --

Column 2,
Line 44, after "involves" insert -- holding and rotating a thin flat semiconductor substrate against a wetted polishing surface --

Signed and Sealed this

Twenty-first Day of January, 2003

JAMES E. ROGAN
*Director of the United States Patent and Trademark Office*